(12) United States Patent
Kaltalioglu et al.

(10) Patent No.: US 7,871,902 B2
(45) Date of Patent: Jan. 18, 2011

(54) CRACK STOP TRENCHES

(75) Inventors: Erdem Kaltalioglu, Newburgh, NY (US); Hermann Wendt, Poughkeepsie, NY (US)

(73) Assignee: Infineon Technologies AG, Neubiberg (DE)

( * ) Notice: Subject to any disclaimer, the term of this patent is extended or adjusted under 35 U.S.C. 154(b) by 179 days.

(21) Appl. No.: 12/030,435

(22) Filed: Feb. 13, 2008

(65) Prior Publication Data

US 2009/0203192 A1   Aug. 13, 2009

(51) Int. Cl.
 *H01L 21/00* (2006.01)
(52) U.S. Cl. .............. 438/462; 438/460; 438/465; 257/620; 257/508
(58) Field of Classification Search .......... None
 See application file for complete search history.

(56) References Cited

U.S. PATENT DOCUMENTS

| 5,024,970 | A | * | 6/1991 | Mori ............ 438/462 |
|---|---|---|---|---|
| 5,789,302 | A | * | 8/1998 | Mitwalsky et al. .......... 438/462 |
| 5,834,829 | A | * | 11/1998 | Dinkel et al. ............. 257/620 |
| 6,022,791 | A | | 2/2000 | Cook et al. |
| 6,084,287 | A | | 7/2000 | Mitwalsky et al. |
| 6,495,918 | B1 | | 12/2002 | Brintzinger |
| 6,895,133 | B1 | | 5/2005 | Calkins et al. |
| 2005/0208781 | A1 | | 9/2005 | Fitzsimmons et al. |
| 2006/0012014 | A1 | * | 1/2006 | Chen et al. .............. 257/635 |
| 2006/0099775 | A1 | | 5/2006 | Daubenspeck et al. |
| 2007/0102792 | A1 | * | 5/2007 | Wu ...................... 257/620 |

* cited by examiner

*Primary Examiner*—Ha Tran T Nguyen
*Assistant Examiner*—Shantanu C Pathak
(74) *Attorney, Agent, or Firm*—Slater & Matsil, L.L.P.

(57) ABSTRACT

Structures and methods of forming crack stop trenches are disclosed. The method includes forming active regions disposed in cell regions of a substrate, the cell regions separated by dicing channels, and forming back end of line (BEOL) layers over the substrate, the BEOL layers being formed over the cell regions and the dicing channels. Crack stop trenches are then formed encircling the cell regions by etching a portion of the BEOL layers surrounding the cell regions. The wafer is diced along the dicing channels.

24 Claims, 10 Drawing Sheets

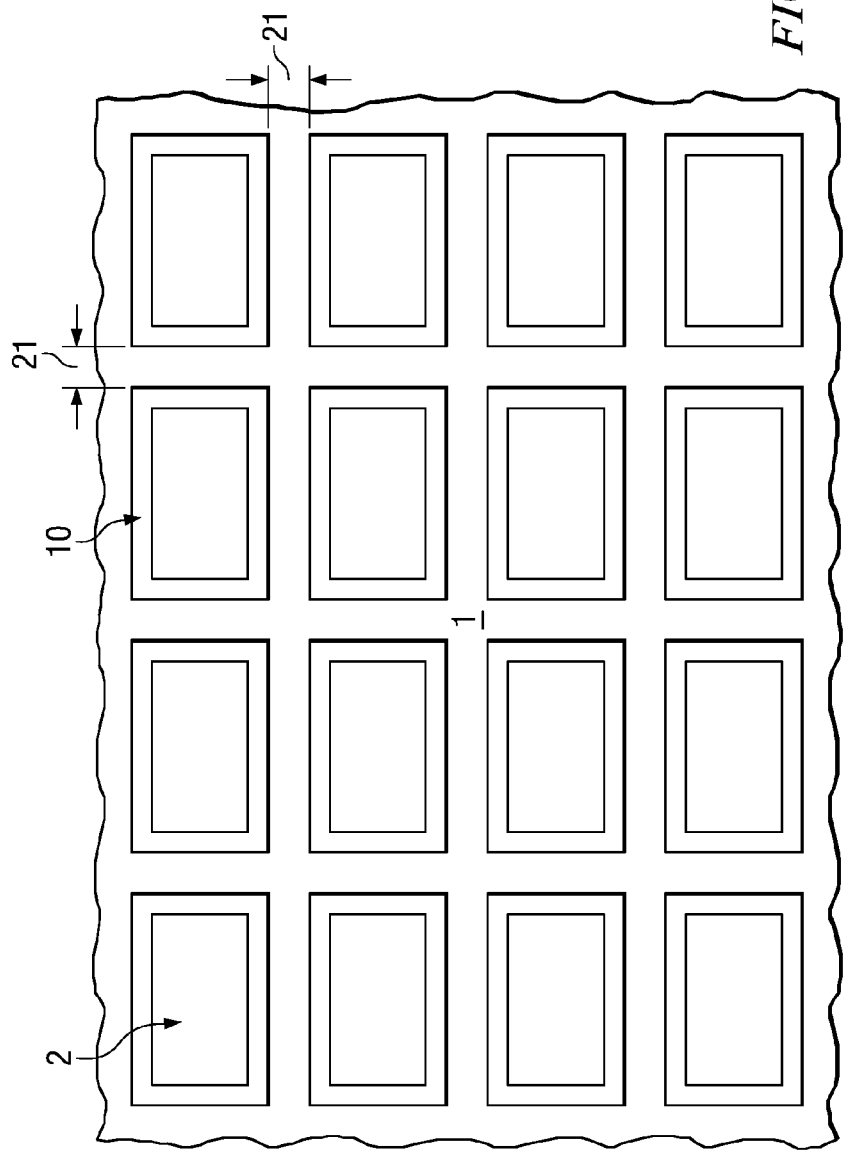
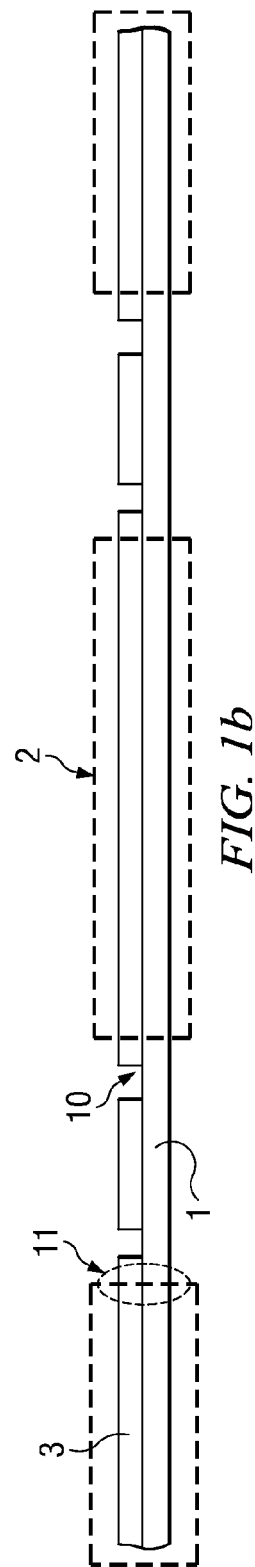
FIG. 1a
FIG. 1b

CRACK STOP TRENCHES

TECHNICAL FIELD

This invention relates generally to electronic devices, and more particularly to crack stop trenches.

BACKGROUND

Semiconductor devices are used in many electronic and other applications. Semiconductor devices comprise integrated circuits that are formed on semiconductor wafers by depositing many types of thin films of material over the semiconductor wafers, and patterning the thin films of material to form the integrated circuits.

Metallization layers are usually the top-most layers of semiconductor devices. The manufacturing of semiconductor devices is typically classified into two phases: the front end of line (FEOL) and the back end of line (BEOL). The BEOL is typically considered to be the point of the manufacturing process where metallization layers are formed, and the FEOL is considered to include the manufacturing processes prior to the formation of metallization layers.

While some integrated circuits have a single top layer of metallization, other integrated circuits comprise multi-level interconnects, wherein two or more metallization layers are formed over a semiconductor wafer or workpiece. Each conductive line layer typically comprises a plurality of conductive lines separated from one another by an insulating material, also referred to as an inter-level dielectric (ILD). Advanced semiconductor processes utilize inter-level dielectrics with low dielectric constants (k) and/or ultra-low dielectric constants (ULK) to minimize interconnect parasitic capacitances.

One of the challenges in semiconductor technology requires developing technologies with good product yield and reliability. Due to their poor mechanical properties, use of low-k and ultra-low dielectric constant materials introduces additional challenges in maintaining yield and component reliability.

Thus, what are needed in the art are semiconductor components containing low-k and ultra-low dielectric constant materials but without comprising product yield or component reliability.

SUMMARY OF THE INVENTION

These and other problems are generally solved or circumvented, and technical advantages are generally achieved, by embodiments of the present invention.

Embodiments of the invention include methods and a structure for preventing delamination and other reliability issues associated with chip dicing processes and chip package interactions. The method includes forming active regions disposed in cell regions of a substrate, the cell regions separated by dicing channels. Back end of line (BEOL) layers are formed in the cell regions and the dicing channels. Crack stop trenches are then formed encircling the cell regions by etching a portion of the BEOL layers surrounding the cell regions. The wafer is then diced along the dicing channels.

The foregoing has outlined rather broadly an embodiment of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 1, which includes FIGS. 1a-1c, illustrates a wafer fabricated in accordance with embodiments of the invention, wherein FIG. 1a illustrates a top view of the wafer, FIG. 1b illustrates a cross-sectional view of the wafer illustrated in FIG. 1a, and FIG. 1c illustrates a magnified portion of an edge of a chip illustrated in FIG. 1b;

FIG. 2, which includes FIGS. 2a and 2b, illustrates the dicing of a portion of a wafer, the portion of the wafer being diced comprising a narrow dicing channel in accordance with embodiments of the invention, wherein FIG. 2a illustrates a part of the wafer before the dicing and FIG. 2b illustrates chips after the dicing step;

FIG. 3, which includes FIGS. 3a and 3b, illustrates the dicing of a portion of a wafer, the portion of the wafer being diced comprising a broad dicing channel in accordance with embodiments of the invention, wherein FIG. 3a illustrates a part of the wafer before the dicing and FIG. 3b illustrates chips after the dicing step;

FIG. 4, which includes FIGS. 4a-4f, illustrates a method for fabrication of a wafer with crack stop trenches surrounding cell regions in various stages of processing, in accordance with embodiments of the invention, wherein FIG. 4a illustrates a top view of a wafer after the formation of BEOL layers and FIGS. 4b-4f illustrate cross-sectional views during subsequent processing;

FIG. 6, which includes FIGS. 6a-6d, illustrates an application of a method for fabrication of a wafer with crack stop trenches formed from a continuous metallic wall in various stages of processing, in accordance with an embodiment of the invention, wherein FIG. 6a illustrates a top view of a wafer after formation of BEOL layers and FIGS. 6b-6d illustrate cross-sectional views during subsequent processing;

FIG. 8, which includes FIGS. 8a-8d, illustrates an application of a method for fabrication of a wafer with crack stop trenches formed from a dual metallic wall structure in various stages of processing, in accordance with an embodiment of the invention, wherein FIG. 8a illustrates a top view of a wafer after the formation of BEOL layers and FIGS. 8b-8d illustrate cross-sectional views during subsequent processing.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

Figure 1C:
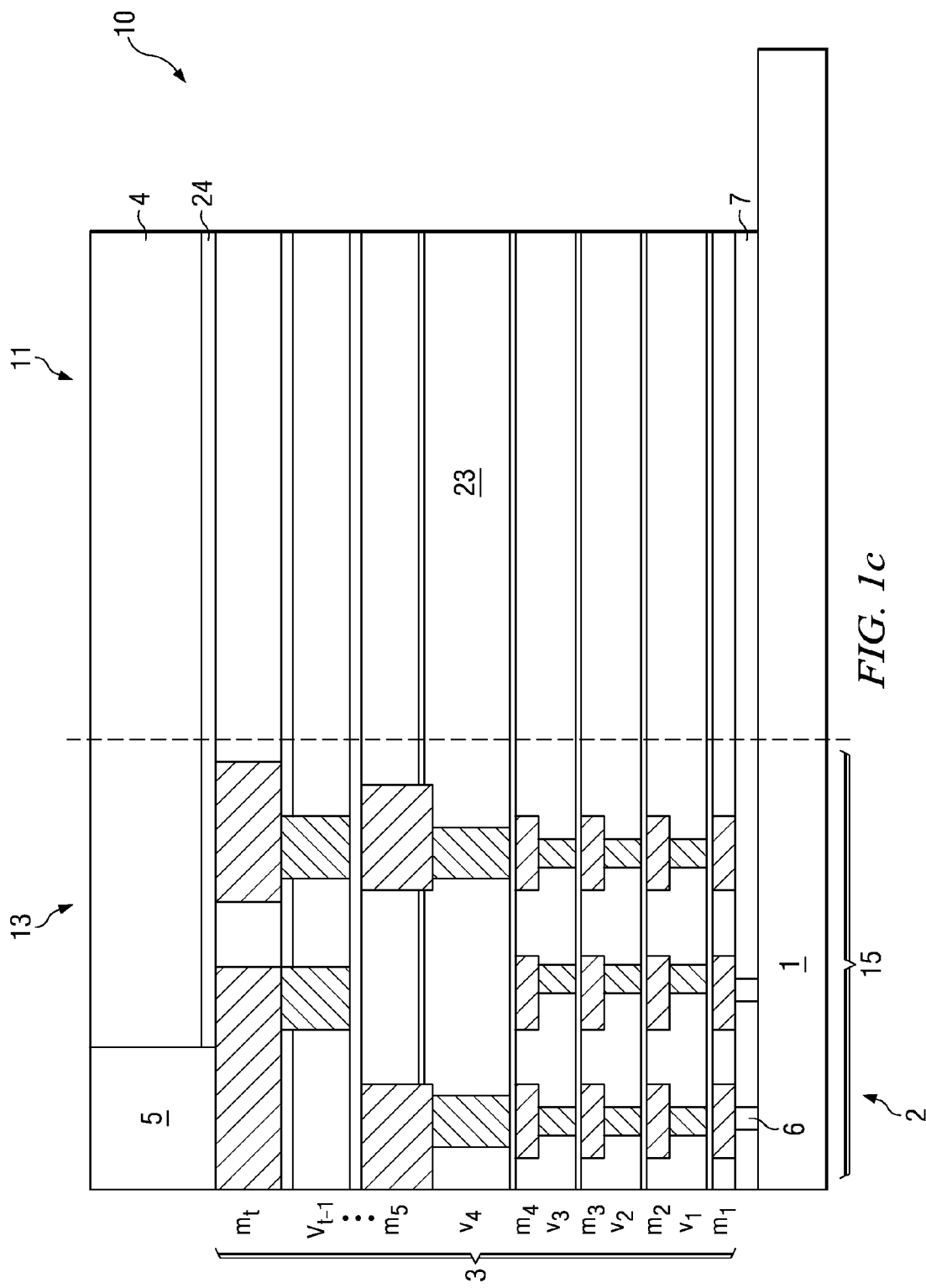

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a structure and method for forming crack stop trenches. In various embodiments, the invention avoids the problems arising from delamination or failure of low-k or ULK dielectric layers during/after chip dicing.

Low-k dielectric materials are used to lower parasitic interconnect capacitances in BEOL or metallization levels. Recent and future technology will likely introduce further lower dielectric constant materials such as ultra low-k dielectric materials. However, the introduction of such materials introduces a number of challenges. For example, low-k materials typically comprise poor mechanical properties. Further, adhesion of these low-k dielectric material layers to adjacent dielectric layers and metal layers is poor. Consequently, low-k dielectric layers are prone to cracks and/or delaminations. Such failure can arise either during processing or during operation of the chip. For example, after the deposition of these low-k dielectric material layers, cracks may develop during subsequent processing of the semiconductor wafer. A significant source of cracks arises from the corners and the edges of the chips either from stress concentrations in the edges or from other mechanical impact. For example, the stresses induced in the edge of the chip during wafer dicing may create micro-cracks or interface delamination that propagate rapidly through the dielectric layers. One way to minimize such micro-crack propagation is the use of a crack-stop structure. The crack-stop structure is a metal wall (a combination of metal lines and vias over many metallization levels) introduced around the periphery of a chip. However, crack stop structures do not ensure complete immunity. For example, large cracks may possess sufficient energy to delaminate the crack stop structure or to break through weak spots in the crack stop structures.

In various embodiments, the present invention overcomes these limitations of crack stop structures and minimizes propagation of cracks during subsequent semiconductor processing by the introduction of crack stop trenches. These trenches introduce a gap in the low-k dielectric layers. Hence, cracks propagating from the periphery are stopped by the trench. Only low-k material layers in the periphery up to the trench are cracked or delaminated.

A structural embodiment of the invention will be first described using FIG. 1. Applications of the embodiment discussed in FIG. 1 during wafer dicing are next discussed in FIGS. 2 and 3, which illustrate structural embodiments of a chip thus fabricated. Embodiments of the methods of fabrication will be described using FIGS. 4, 6 and 8 and the flow charts of FIGS. 5, 7 and 9.

An embodiment of the invention is illustrated in FIG. 1 which includes FIGS. 1a-1c. FIG. 1 illustrates a part of a wafer after the formation of chips 2, but before their individual separation by a dicing process. FIG. 1a illustrates a top view of a semiconductor wafer comprising chips 2 disposed in a substrate 1. The substrate 1 comprises active devices forming the active circuitry of the semiconductor chip. The active circuitry contains the active device regions and includes necessary transistors, resistors, capacitors, inductors or other components used to form integrated circuits. For example, active areas that include transistors (e.g., CMOS transistors) can be separated from one another by isolation regions, e.g., shallow trench isolations.

The chips 2 also comprise metallization levels formed over the active device regions to electrically contact and interconnect the active devices. The metallization and active device regions together form a completed functional integrated circuit. In other words, the electrical functions of the chip 2 can be performed by the interconnected active circuitry.

The chips 2 are separated by a dicing channel 21. The dicing channel 21 may comprise alignment marks for dicing as well as other structures such as test and monitoring structures. Dicing channels 21 are typically about 10 um to about 200 um wide. The chips 2 are surrounded by crack stop trenches 10 and prevent cracks from propagating from the dicing channels 21 into the chips 2.

FIG. 1b illustrates a vertical cross section of a portion of the wafer illustrated in FIG. 1a. The chips 2 comprise BEOL layers 3 disposed above the substrate 1. The crack stop trenches 10 are formed in a periphery 11 of the chips 2. A magnified view of the periphery 11 is illustrated in FIG. 1c. FIG. 1c illustrates the edge of the active regions of the chips 2—chip edge 15. Surrounding the chip edge 15 is the periphery 11. The chip edge 15 may contain structures such as a crack stop 13, as well as other structures such as a moisture barrier.

FIG. 1c illustrates the BEOL layers 3 formed with metal levels $m_1$ to $m_t$ and corresponding via levels $v_1$ to $v_{t-1}$. Each metal level comprises metal lines embedded in an inter-level dielectric layer 23. The inter-level dielectric layers 23 preferably comprise a low-k dielectric material such as a material selected from the group comprising fluorinated silicate glass (FSG), carbon doped glass (such as Black Diamond™, Coral™, Aurora™), organo silicate glass (OSG), hydrogen doped glass, porous carbon doped glass, porous silicon dioxide, polymeric dielectrics (e.g., FLARE™, SILK™), F-doped amorphous carbon, silicone based polymeric dielectrics such as hydrogen silsesquioxane (HSQ) and methylsilsesquioxane (MSQ). The top layers of the inter-level dielectric layers 23 in different embodiments comprise $SiO_2$ or FSG (e.g. $v_{t-1}$ and $m_t$). In some embodiments, the inter-level dielectric layer 23 comprises ultra low-k materials such as porous silicate glass, xerogel, aerogel, nano clustered silica (NCS), porous organo silicate glass, porous organics. The interconnect stack in the BEOL layers 3 may comprise any combination of the above dielectric materials.

The metal lines $m_1$ to $m_t$ connect the various active devices on the chip, whereas the via levels $v_1$ to $v_{t-1}$ connect the different metal levels. The metal lines and vias preferably comprise an inner metal core and an outer metal liner. The inner metal core preferably comprises copper, although other metal may also be used in some embodiments. The outer metal liner preferably comprises TiN or TaN (or any other suitable metal liner materials), although in various embodiments, the metal lines comprise tungsten and/or aluminum (or an interconnect stack comprised of any combination of the inner metal core materials).

The inter-level dielectric layers 23 are further separated, for example, by etch stop layers 24. The etch stop layers 24 preferably comprise a material comprising SiCHN such as nBLOK™, although, in other embodiments other nitrides or other suitable materials may be used. Examples of etch stop layers 24 include materials such as silicon nitride (SiN), silicon oxynitride (SiON), silicon carbide (SiC) or silicon carbo nitride (SiCN).

The BEOL layers 3 are typically covered with an additional passivation layer 4 and suitable structure forming contacts. In logic devices, the metallization may include many layers, e.g., nine or more, of copper or alternatively of other metals. In memory devices, such as DRAMs, the number of metal levels may be less and they may be aluminum.

As illustrated in FIG. 1c, the chip edge 15 comprises a crack stop structure 13. However, this is optional and may not be present in some embodiments. The crack stop trench 10 is disposed in the inter-level dielectric layers 23 of the periphery 11. In various embodiments, a ratio of depth to width of the crack stop trenches 10 is about 1:1, although in other embodiments this ratio may comprise other values. In one embodiment, the periphery 11 comprises only a ring of dielectric layers. The periphery 11 comprises no metal lines or vias disposed in the inter-level dielectric layer 23. Hence, the low-k dielectric layers 23 and etch stop layers 24 are the only the layers disposed in the periphery 11. Contact plugs 6 are disposed in an insulation layer 7 such as, for example, a TEOS layer. As illustrated in FIG. 1c, a passivation layer 4 is disposed over the BEOL layers 3, and may comprise additional features for contacting the upper metallization levels. For example, a contact pad 5 is disposed in the passivation layer 4 and provides electrical contacts to the metallization levels.

Figure 2A:
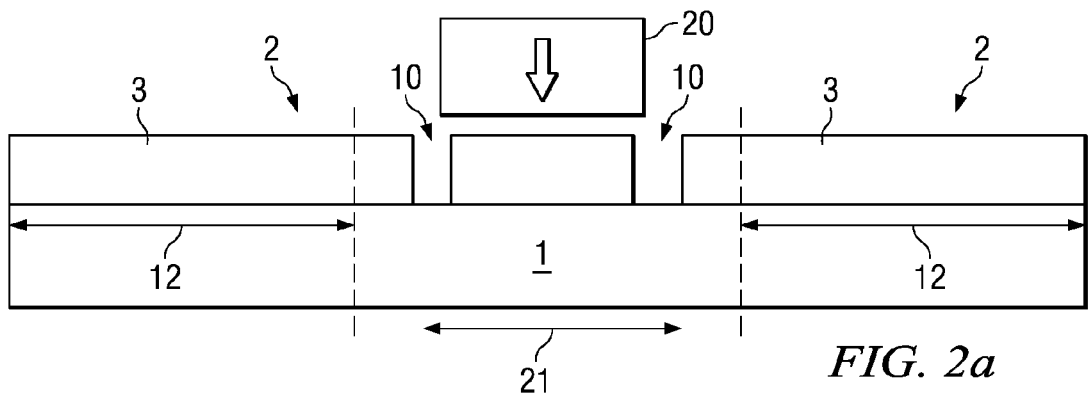

An embodiment of the invention illustrating the dicing process is described in FIGS. 2 and 3. FIG. 2 illustrates the dicing process for a narrow dicing channel 21. FIG. 2a illustrates the wafer after formation of the chips 2 separated by dicing channel 21. The chip cores 12 (the region of the chip with active circuitry) of the chips 2 surrounded by crack stop trenches 10 are diced by a dicing saw. A dicer 20 may be aligned by alignment marks (not shown) to the dicing channel 21. The dicer 20 dices through the BEOL layers 3 and the substrate 1. In various embodiments, dicing is performed by mechanical sawing, by scribing and then breaking or by laser cutting. As there is no physical contact between the dicer 20 and the periphery 11 (see FIG. 1) adjacent the crack stop trenches 10, micro-cracks introduced in the BEOL layers 3 of the dicing channel 21 during the dicing process are not transferred into the periphery 11 of the chips 2. Thus, the integrity of the BEOL layers 3 is preserved.

Figure 2B:
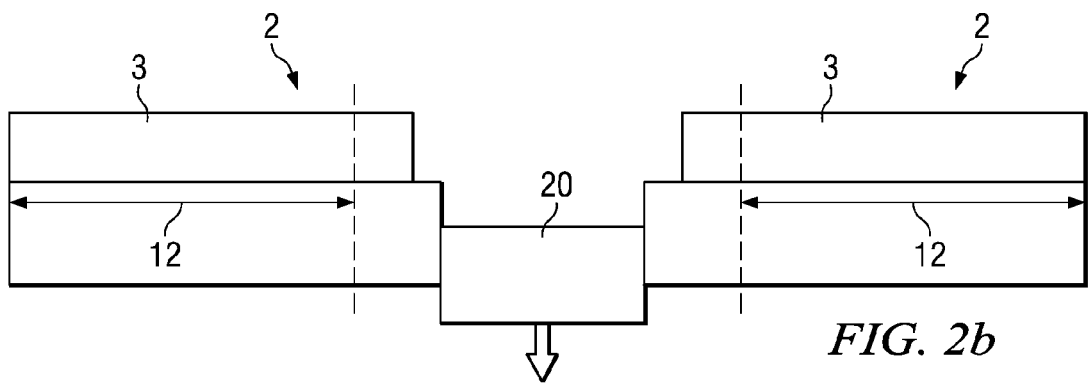

Referring to FIG. 2b, individual dies are generated after the dicing process. Following the dicing process the individual silicon chips 2 are encapsulated into packages which are then suitable for use in building electronic devices such as computers, etc. During dicing, silicon wafers are typically mounted on dicing tape or a holder to support the wafer. Once a wafer has been diced, the dies are integrated into a leadframe package or placed directly on a PC board substrate as a bare die or packaged using solder bumping technologies. Once a wafer has been diced, the die will stay on the dicing tape until they are extracted by die handling equipment, like a die bonder or die sorter, further in the electronics assembly process.

Figure 3A:
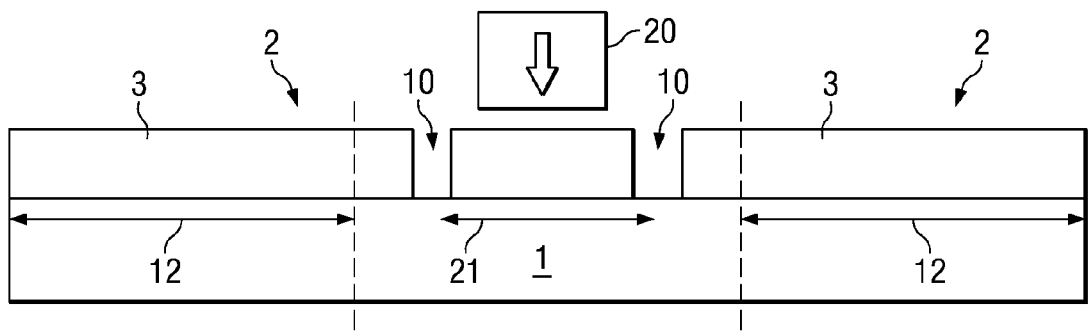
Figure 3B:
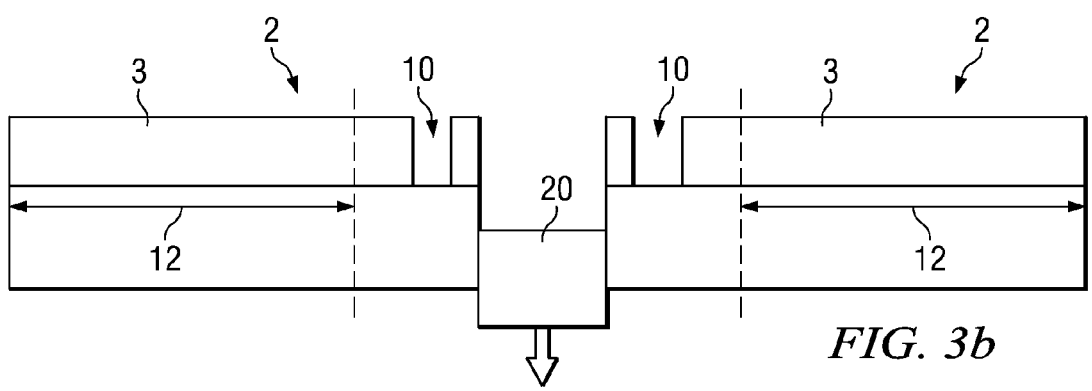

FIGS. 3a and 3b illustrate an embodiment of the dicing process comprising a wide dicing channel. As illustrated in FIG. 3a, the head of the dicer 20 is smaller than the width of the dicing channel 21. Consequently, as illustrated in FIG. 3b, the final die also comprise the crack stop trenches 10.

Figure 4A:
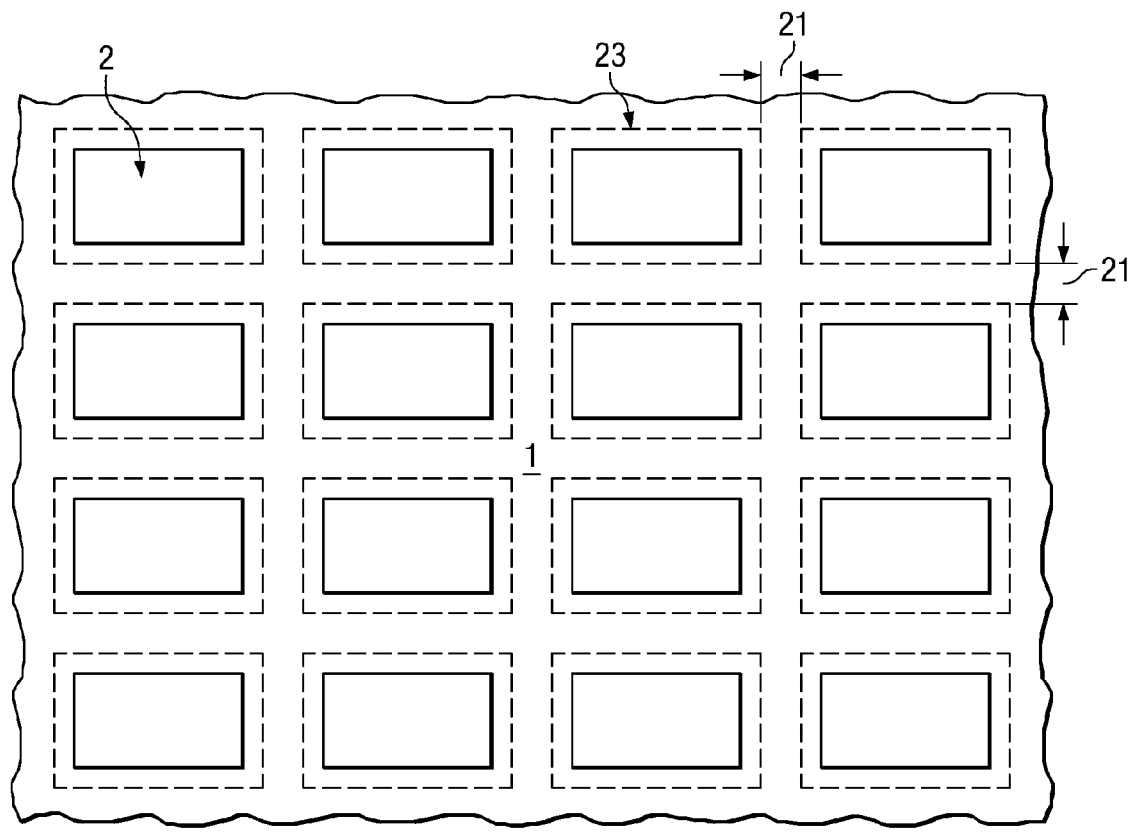

A method of fabrication of the structure will now be described using FIG. 4 and the flow chart of FIG. 5, in accordance with an embodiment of the invention. FIG. 4a illustrates a top view of a plane of the wafer after back end of the line processing, and FIGS. 4b-4f illustrate cross sectional views of a portion of the wafer during subsequent fabrication process.

FIG. 4a illustrates a portion of the wafer after formation of metallization levels (BEOL layers 3) in the back end of line processing. As illustrated the chip 2 is surrounded by a region comprised only of dielectric layers. In one embodiment, a top cutline comprises an inter level dielectric layer 23 surrounding the chip 2.

Figure 4B:
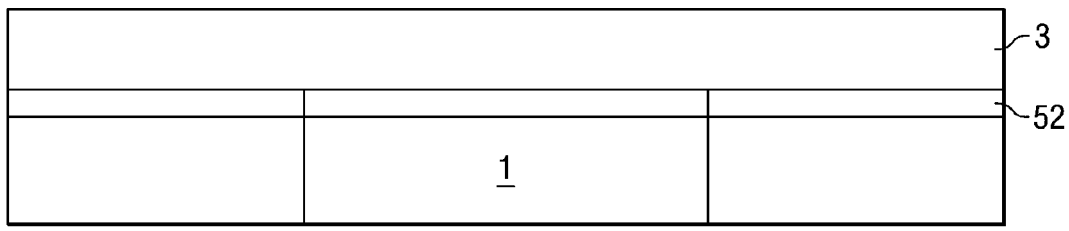
Figure 4C:
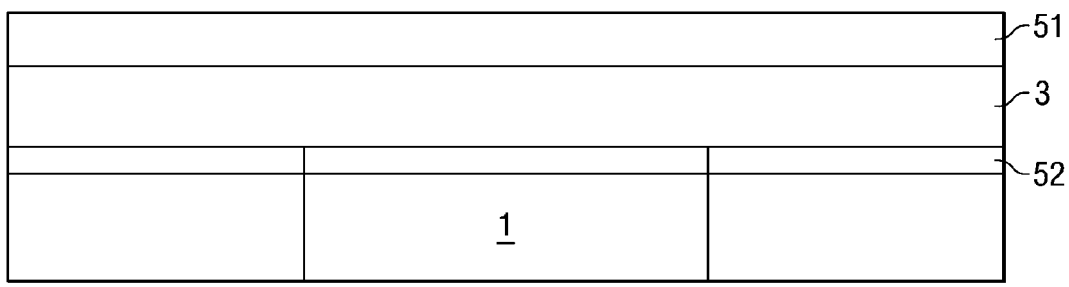
Figure 4D:
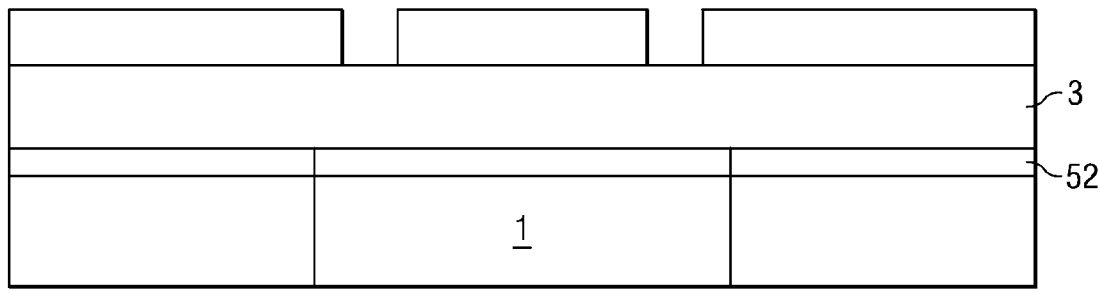
Figure 4E:
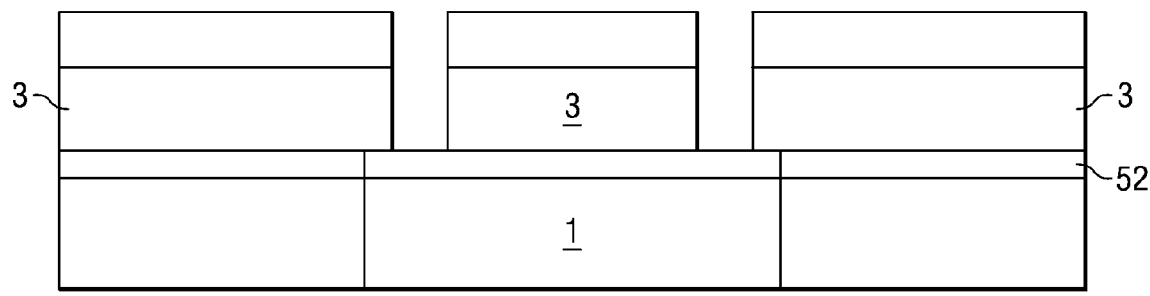
Figure 5:
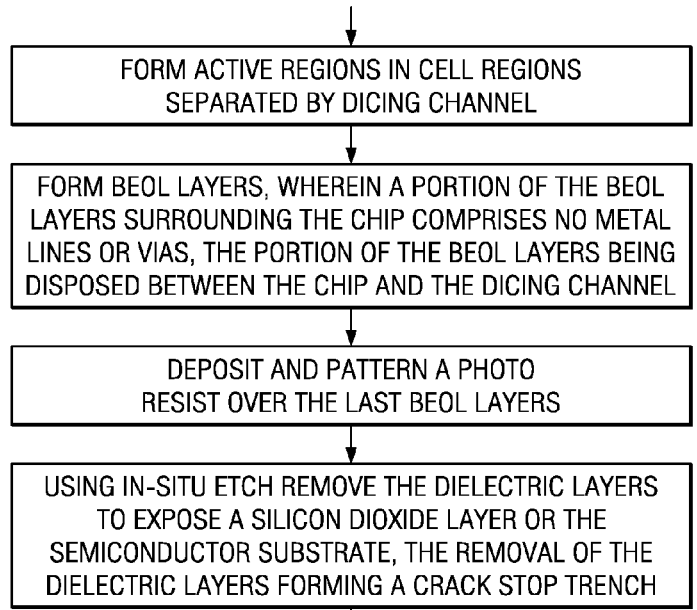
FIG. 5 illustrates a flow chart for formation of the wafer illustrated in FIG. 4, in accordance with embodiments of the invention.

FIG. 4b refers to a cross sectional view of the chip 2 illustrated in FIG. 4a. At this stage, the wafer has undergone all front and back end processing as in conventional semiconductor processing, including formation of passivation layers and contacts. The BEOL layers 3 (comprising the interconnect structure) are disposed over the substrate 1, and may comprise an additional liner layer 52 such as an oxide layer. The liner layer 52 may be used as an passivation layer for the active devices embedded in the silicon substrate (or as an etch stop during subsequent etch processes). As illustrated in FIG. 4c, a photo resist 51 is deposited. An optional hard mask (not shown) may be deposited prior to the deposition of the photo resist 51. The optional hard mask may be necessary in various embodiments to protect the top layers of the chips 2 during subsequent etching. As illustrated in FIG. 4d, the photo resist 51 is patterned and the underlying exposed BEOL layers 3 are etched. The etch is performed using a dry etch to ensure an anisotropic etch. The etch chemistry is modified during the etching process to etch through the different BEOL layers 3 as shown in FIG. 4e. For example, inter-level dielectric layers 23 and etch stop layers 24 illustrated in FIG. 1c are etched in-situ in a single etch process. The in-situ etch preferably comprises a reactive ion etch (RIE). The chemistry of the RIE process is selected to ensure a high etch rate on the inter level dielectric layer 23 and the etch stop layer 24 by a suitable combination of etch chemistries. For example, for etching the inter level dielectric layer 23, a chemistry comprising $CF_4/O_2$ may be used. The etchants comprise a gas flow rate comprising about 15% $O_2$. The removal rate of the inter level dielectric layer 23 increases with an increase in oxygen content up to about 15%. However, beyond about 15% oxygen, the etch rate or removal rate decreases with an increase in oxygen content. The $CF_4/O_2$ chemistry is fairly unselective and removes the underlying etch stop layer 24. Hence, a single etch process may be used in various embodiments. To maintain a significant etch rate, the gas pressure is in the range above about 100 mT.

Figure 4F:
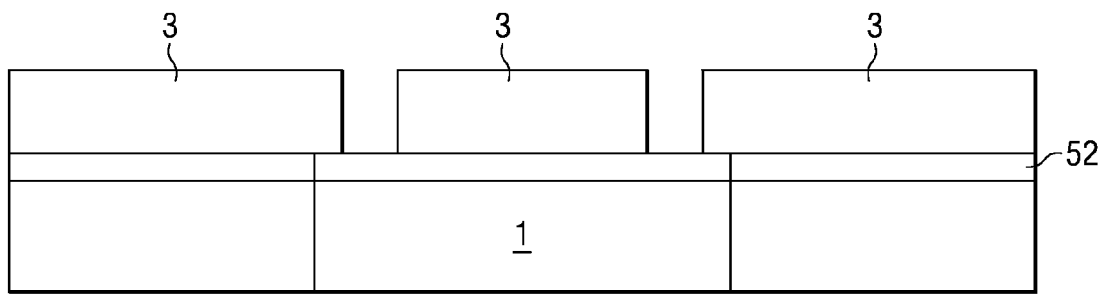

In some embodiments, to avoid etching other layers, for example, to avoid etching all the photo resist 51, $CHF_3$ may be additionally added. In some embodiments, alternately a different chemistry, for example, comprising $CF_4/H_2$ may be used. This chemistry may be used especially if higher selectivity is needed at the expense of a lower removal rate. Referring next to FIG. 4f, any remaining photo resist 51 is removed forming the crack stop trenches 10. In other embodiments, a wet etch process may be used.

Although, techniques such as laser melting may be used to form crack stop trenches 10, the etching process used in this embodiment is advantageous as it does not damage the remaining BEOL layers 3 or substrate 1 (unlike laser melting). If processes like laser melting are used, the BEOL layers melt locally along the edges and form re-solidified zones or regions. Further, silicon defects such as dislocations also may be generated due to the high temperatures used. In various embodiments, the present invention avoids these problems by using an etch process to form the crack stop trenches 10. Hence, the crack stop trenches 10 formed by the various embodiments comprise edges that are distinct with no local melting or fusing of the BEOL layers 3. The substrate 1 below is also free of defects.

Figure 6A:
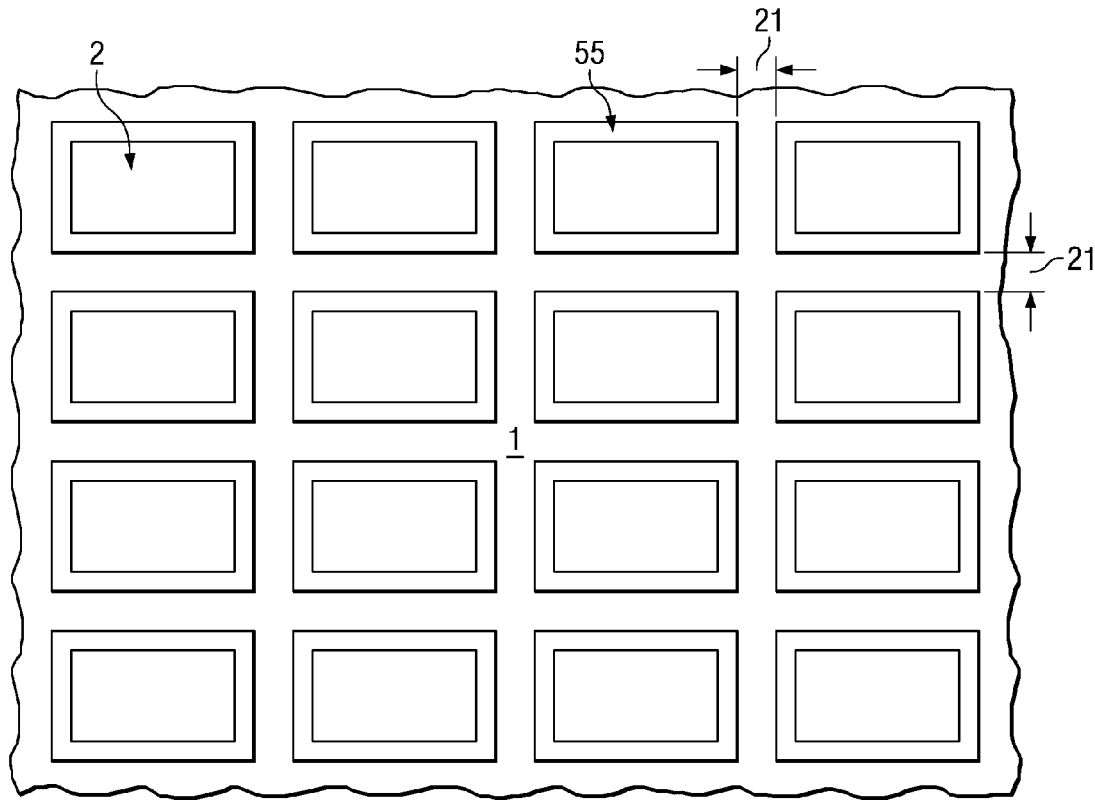

A method of fabrication of the structure comprising a metallic wall surrounding the chip will be described using FIG. 6 and the flow chart of FIG. 7, in accordance with an embodiment of the invention. FIG. 6a illustrates a top view of a plane of the wafer after back end of line processing, and FIGS. 6b-6d illustrate cross sectional views of a portion of the wafer during the fabrication process.

As in the prior embodiment, FIG. 6a illustrates a portion of the wafer after formation of metallization levels in the back end of line processing. As illustrated in FIG. 6a, the chip 2 is surrounded by a region comprising a continuous metal layer embedded in the dielectric layer. For example, a top cut-line illustrates the metallic wall 55 surrounding the chip 2.

Figure 6B:
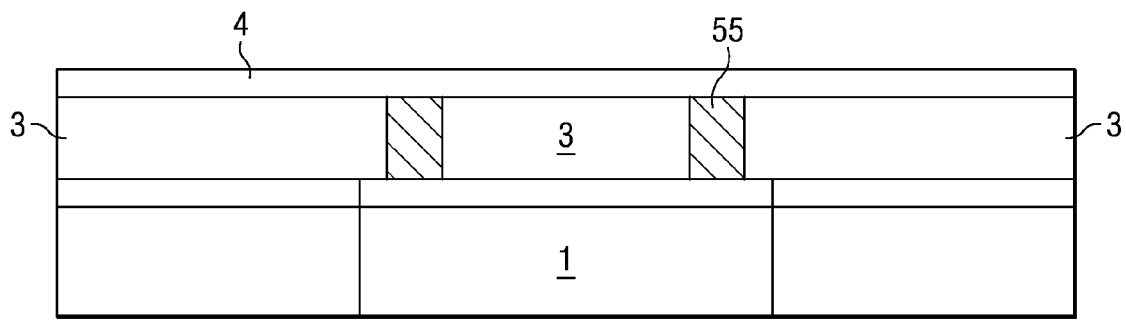
Figure 6C:
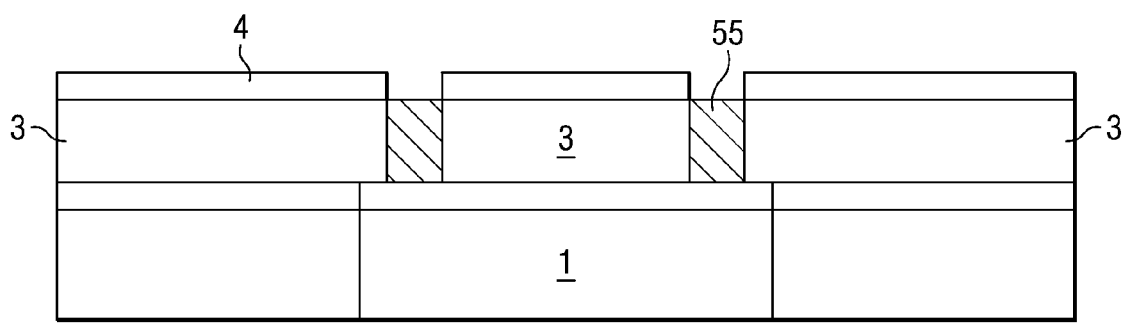
Figure 6D:
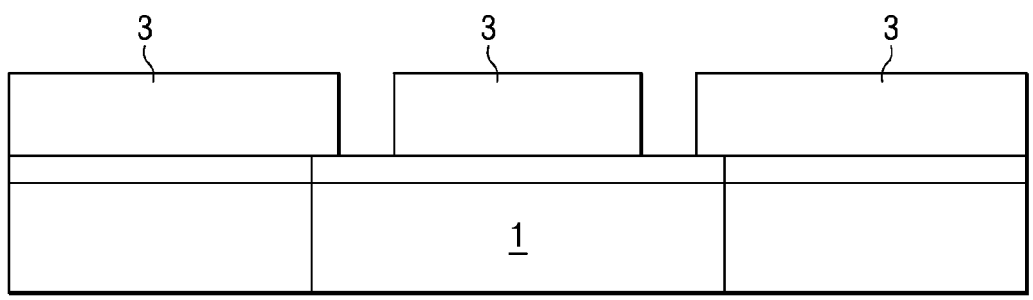
Figure 7:
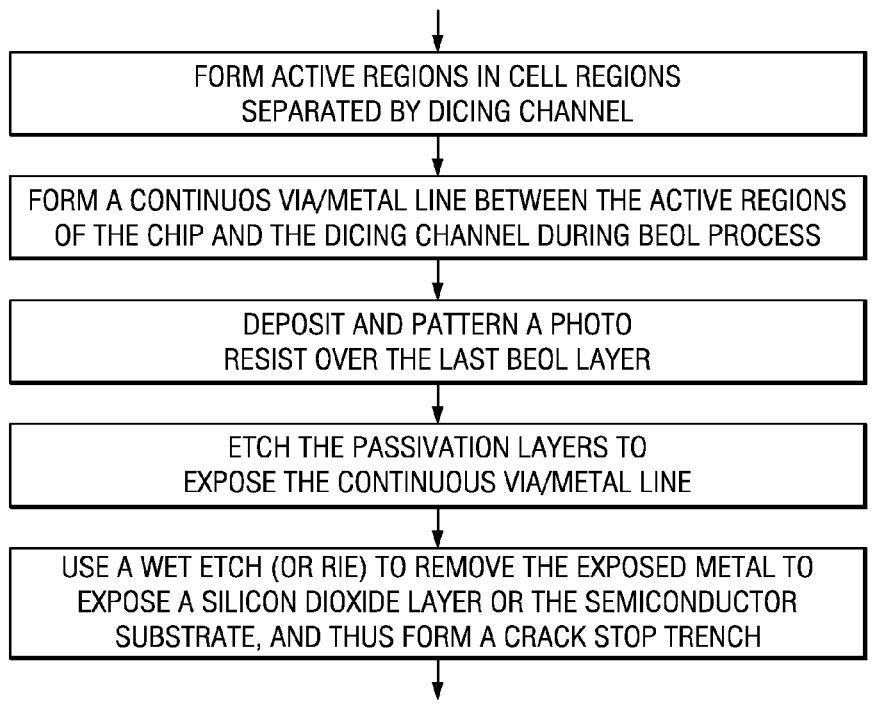
FIG. 7 illustrates a flow chart for formation of the wafer illustrated in FIG. 6, in accordance with embodiments of the invention.

As in the prior embodiment, FIG. 6b illustrates the cross sectional view of the wafer after front and back end processing. However, in this embodiment, during back end processing, in the BEOL layers 3 a metallic wall 55 is fabricated in the periphery region of the chip. Hence, during the formation of each metal line and via level, metal is deposited (electro plated) forming a continuous metallic wall 55. A photo resist layer (not shown) is deposited over the top surface of the wafer, and patterned. Using the photo mask, the passivation layer 4 is patterned to expose the inter-level dielectric layers 23 (FIG. 6b). The inter-level dielectric layers 23 and the metallic walls 55 are next exposed (FIG. 6c). A wet etch removes the metallic wall 55 in a subsequent process (FIG. 6d). As in the prior embodiment, a plasma etch may also be used instead of the wet etch. Any remaining photo resist layer 51 disposed over the chip 2 is removed.

Figure 8A:
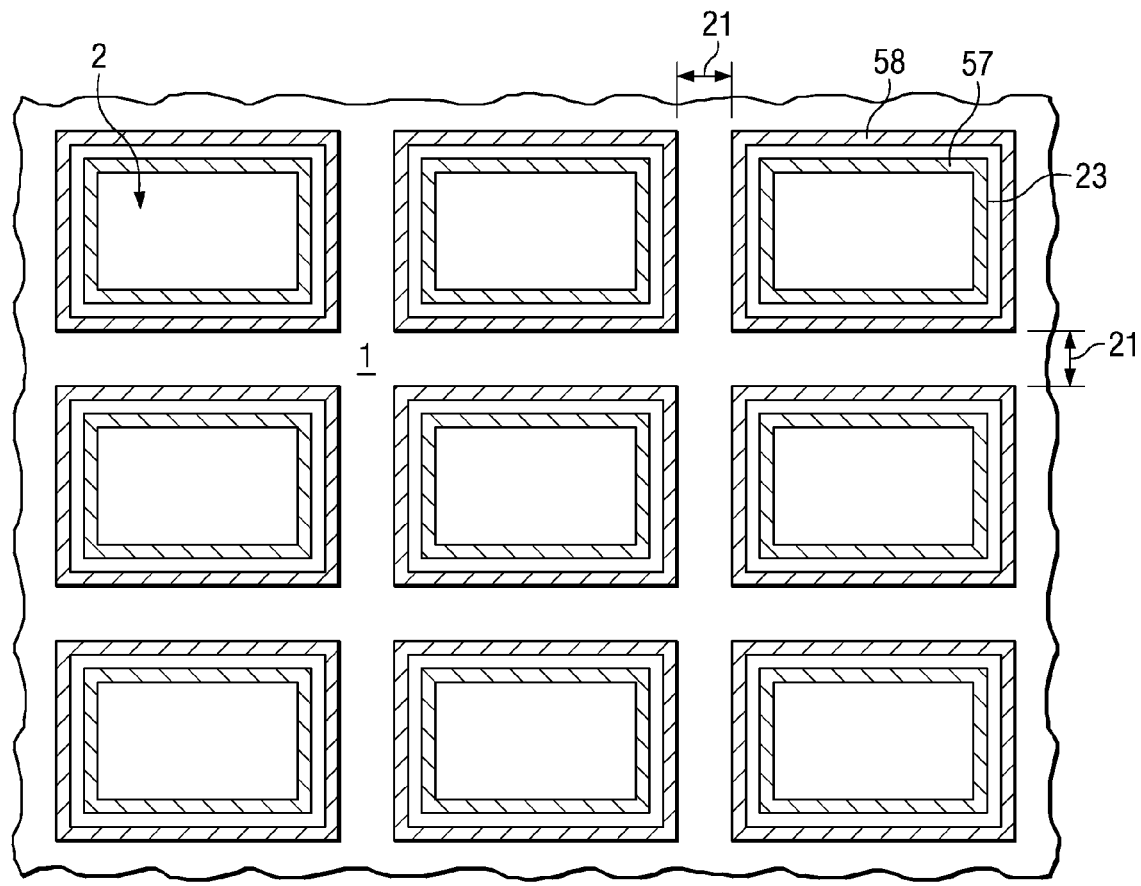

A method of fabrication of the structure comprising a dual metallic wall surrounding the chip will now be described using FIG. 8 and the flow chart of FIG. 9, in accordance with an embodiment of the invention. FIG. 8a illustrates a top view of a plane of the wafer after back end of line processing, and FIGS. 8b-8d illustrate cross sectional views of a portion of the wafer during the fabrication process.

In this embodiment, dual metallic walls comprising an inner metallic wall 57 and an outer metallic wall 58 are formed around the chip 2 in the BEOL layers 3, during the back end processes as illustrated in FIG. 8a. The inner metallic wall 57 and the outer metallic wall 58 are separated by a region comprising no metallic lines or vias and hence comprising only dielectric layers. The dual metallic wall surrounds the chip 2 and comprises a continuous vertical wall of metal formed from metal lines and vias in the inter-level dielectric layer 23.

Figure 8B:
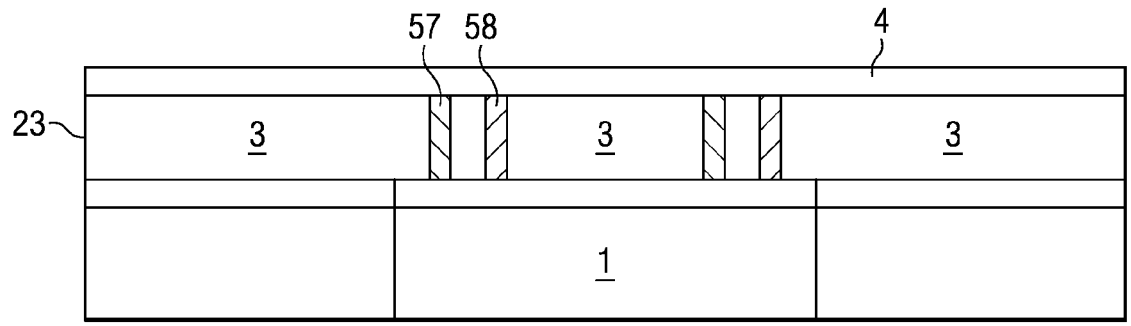
Figure 9:
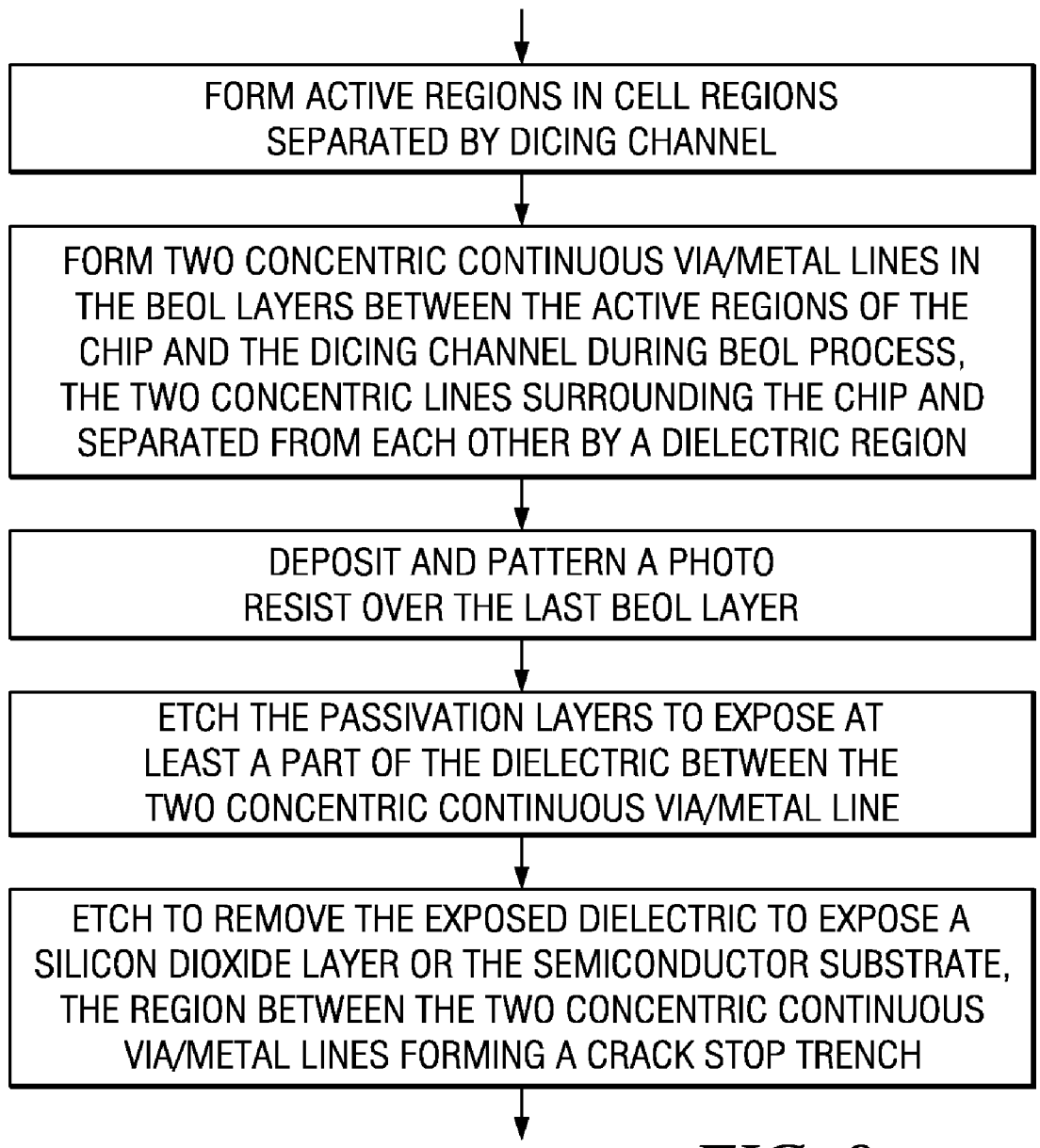
FIG. 9 illustrates a flow chart for formation of the wafer illustrated in FIG. 8, in accordance with embodiments of the invention.

FIG. 8b illustrates a cross sectional view of this embodiment shown in FIG. 8a illustrating the inner metallic wall 57 and the outer metallic wall 58 formed in the BEOL layers 3. A passivation layer 4 is disposed above the BEOL layers 3. The region between the inner metallic wall 57 and the outer metallic wall 58 comprises inter level dielectric layers 23.

Figure 8C:
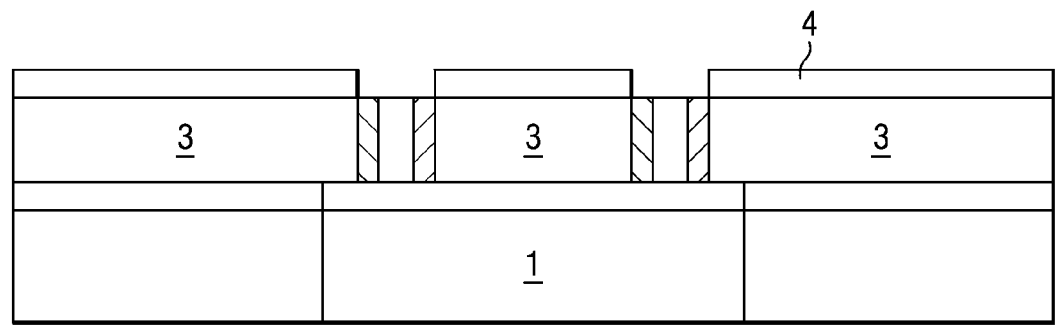
Figure 8D:
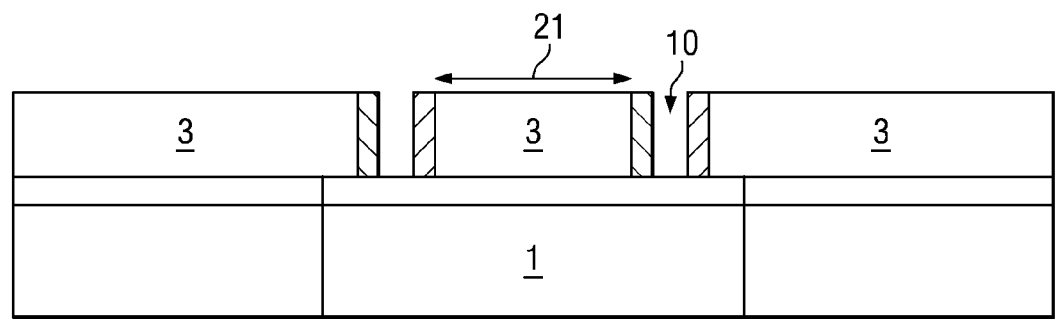

As illustrated in FIG. 8c, a photo resist is deposited and patterned (not shown) and used to pattern the passivation layer 4. The resulting pattern exposes the inter level dielectric layers 23 between the inner metallic wall 57 and the outer metallic wall 58. As illustrated in FIG. 8d, an etch, for example, a plasma etch may be used to remove the inter level dielectric layers 23 between the inner metallic wall 57 and the outer metallic wall 58. Hence, the crack stop trench 10 is lined with inner and outer metallic walls 57 and 58. The inner metallic wall 57 reinforces the trench sidewall and further protects the BEOL layers 3 in the chip 2, either from microcracks arising from the crack stop trench 10 or from the central regions of the dicing channel 21.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of making a semiconductor component, the method comprising:
    forming active regions disposed in cell regions of a substrate, the cell regions separated by dicing channels;
    forming back end of line (BEOL) layers over the substrate, the BEOL layers being formed over the cell regions and the dicing channels, the BEOL layers comprising metal lines and vias embedded in an inter level dielectric layer;
    forming crack stop trenches encircling the cell regions by etching the BEOL layers surrounding the cell regions, wherein a portion of the BEOL layers surrounding the cell regions comprises an inner continuous metallic wall on an edge of each cell region and an outer continuous metallic wall on an edge of the dicing channel, wherein the portion of the BEOL layers between the inner continuous metallic wall and the outer continuous metallic wall comprises no metal, and wherein forming the crack stop trenches encircling the cell regions comprises etching the BEOL layers between the inner continuous metallic wall and the outer continuous metallic wall; and
    dicing the substrate by dicing along the dicing channels.

2. The method of claim 1, wherein dicing the substrate comprises aligning a dicer over the dicing channel and dicing the substrate and the BEOL layers, and wherein the dicer does not physically contact the crack stop trenches.

3. The method of claim 1, wherein the inter-level dielectric layer comprises a material selected from the group consisting of fluorinated silicate glass (FSG), carbon doped glass, organo silicate glass (OSG), hydrogen doped glass, porous carbon doped glass, porous silicon dioxide, polymeric dielectrics, F-doped amorphous carbon, and silicone based polymeric dielectrics.

4. The method of claim 1, wherein a ratio of depth to width of each crack stop trench comprises a value of about 1:1.

5. A method of making a semiconductor component, the method comprising:
    forming active regions disposed in cell regions of a substrate, the cell regions separated by dicing channels;
    forming back end of line (BEOL) layers over the substrate, the BEOL layers comprising metal lines and vias embedded in dielectric layers, wherein the BEOL layers are formed over the cell regions and the dicing channels, wherein a portion of the BEOL layers surrounding the cell regions comprises an inner continuous metallic wall on an edge of the cell regions and an outer continuous metallic wall on an edge of the dicing channels, wherein a region of the BEOL layers between the inner continuous metallic wall and the outer continuous metallic wall comprises no metal;

forming crack stop trenches encircling the cell regions by etching the portion of the BEOL layers surrounding the cell regions, wherein forming crack stop trenches encircling the cell regions comprises etching the region of the BEOL layers between the inner continuous metallic wall and the outer continuous metallic wall; and dicing the substrate by dicing along the dicing channels.

6. The method of claim 5, wherein the BEOL layers comprise metal lines and vias embedded in an inter-level dielectric material.

7. A method of making a semiconductor component, the method comprising:

forming cell regions comprising active circuitry, the cell regions separated by dicing channels;

forming back end of line (BEOL) layers disposed over the cell regions and the dicing channels; and forming crack stop trenches disposed in a portion of the BEOL layers, the crack stop trenches disposed between the cell regions and the dicing channels, wherein the crack stop trenches are disposed in the BEOL layers and form a continuous structure encircling the cell regions, wherein sidewalls of the crack stop trenches comprise edges of the BEOL layers, wherein each layer of the BEOL layers is distinct in the edges of the BEOL layers, wherein a portion of the BEOL layers surrounding the cell regions comprises an inner continuous metallic wall on an edge of each cell region and an outer continuous metallic wall on an edge of the dicing channel, wherein the portion of the BEOL layers between the inner continuous metallic wall and the outer continuous metallic wall comprises no metal, and wherein forming the crack stop trenches comprises etching the portion of the BEOL layers between the inner continuous metallic wall and the outer continuous metallic wall.

8. The method of claim 7, wherein the sidewalls of the crack stop trenches comprise metal lines and vias.

9. The method of claim 7, wherein the BEOL layers comprise metal lines and vias embedded in a dielectric material.

10. The method of claim 9, wherein the dielectric material comprises a low-k material.

11. The method of claim 9, wherein the dielectric material comprises fluorinated silicon glass.

12. The method of claim 9, wherein the dielectric material comprises un-doped silicon glass.

13. The method of claim 9, wherein the dielectric material comprises an ultra low-k material.

14. The method of claim 13, wherein the ultra-low-k material comprises a material selected from the group consisting of porous carbon doped glass, porous silicon dioxide, polymeric dielectrics, F-doped amorphous carbon, silicone based polymeric dielectrics, and air gaps.

15. The method of claim 9, wherein the dielectric material comprises silicon nitride.

16. The method of claim 9, wherein the dielectric material comprises a combination of materials selected from the group consisting of fluorinated silicon glass, un-doped silicon glass, silicon nitride and ultra-low-k material.

17. The method of claim 9, wherein the metal lines comprise a liner metal and an inner core metal.

18. The method of claim 17, wherein the liner metal comprises a metal selected from the group consisting of TiN, Ta, TaN, Ti, W, and Ru and wherein the inner core metal comprises copper, aluminum, or tungsten.

19. The method of claim 7, wherein the crack stop trenches comprise a ratio of depth to width of about 1:1.

20. A method of making a semiconductor component comprising:

forming cell regions comprising active circuitry in a substrate;

forming back end of line (BEOL) layers over the substrate; and forming a crack stop trench sidewall adjacent and above a diced edge of the substrate, the crack stop trench sidewall facing the diced edge of the substrate and encircling the cell regions, wherein the crack stop trench sidewall comprises edges of distinct BEOL layers, wherein a portion of the BEOL layers surrounding the cell regions comprises an inner continuous metallic wall on an edge of each cell region and an outer continuous metallic wall on an edge of a dicing channel, wherein the portion of the BEOL layers between the inner continuous metallic wall and the outer continuous metallic wall comprises no metal, and wherein forming the crack stop trench comprises etching the portion of the BEOL layers between the inner continuous metallic wall and the outer continuous metallic wall.

21. The method of claim 20, wherein the distinct BEOL layers do not comprise re-solidified zones.

22. A method of forming a semiconductor component comprising:

forming cell regions comprising active circuitry in a substrate;

forming back end of line (BEOL) layers over the substrate; and forming crack stop trenches in the BEOL layers adjacent and above a diced edge of the substrate, wherein the crack stop trenches form a continuous structure encircling the cell regions, and wherein sidewalls of the crack stop trenches comprise edges of the BEOL layers, wherein each layer of the BEOL layers is distinct in the edges of the BEOL layers, wherein a portion of the BEOL layers surrounding the cell regions comprises an inner continuous metallic wall on an edge of each cell region and an outer continuous metallic wall on an edge of a dicing channel, wherein the portion of the BEOL layers between the inner continuous metallic wall and the outer continuous metallic wall comprises no metal, and wherein forming the crack stop trenches comprises etching the portion of the BEOL layers between the inner continuous metallic wall and the outer continuous metallic wall.

23. The method of claim 22, wherein the distinct edges of the BEOL layers do not comprise re-solidified zones.

24. The method of claim 22, wherein the BEOL layers comprise metal lines and vias embedded in a dielectric material.

* * * * *